(12) United States Patent
Ayazi

(10) Patent No.: US 7,767,484 B2
(45) Date of Patent: Aug. 3, 2010

(54) METHOD FOR SEALING AND BACKSIDE RELEASING OF MICROELECTROMECHANICAL SYSTEMS

(75) Inventor: Farrokh Ayazi, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 219 days.

(21) Appl. No.: 11/807,848

(22) Filed: May 30, 2007

(65) Prior Publication Data

US 2007/0281381 A1    Dec. 6, 2007

Related U.S. Application Data

(60) Provisional application No. 60/809,772, filed on May 31, 2006.

(51) Int. Cl.
*H01L 21/00* (2006.01)
*H01L 21/30* (2006.01)

(52) U.S. Cl. ............... 438/52; 438/50; 438/53; 438/456; 257/E29.324; 257/E21.613

(58) Field of Classification Search .......... 257/E29.324, 257/E21.613; 438/50, 52, 53, 456
See application file for complete search history.

(56) References Cited

U.S. PATENT DOCUMENTS

| | | | |
|---|---|---|---|
| 3,719,074 A | 3/1973 | Lynch | |
| 4,170,336 A | 10/1979 | Malis | |
| 4,793,195 A | 12/1988 | Koning | |
| 5,153,476 A | 10/1992 | Kosinski | |
| 5,196,905 A | 3/1993 | Hahn et al. | |
| 5,226,321 A | 7/1993 | Varnham et al. | |
| 5,450,751 A | 9/1995 | Putty et al. | |
| 5,563,343 A | 10/1996 | Shaw et al. | |
| 5,783,749 A | 7/1998 | Lee et al. | |
| 5,852,242 A | 12/1998 | Devolk et al. | |
| 5,963,788 A | 10/1999 | Barron et al. | |
| 6,074,890 A * | 6/2000 | Yao et al. ................ 438/52 |
| 6,079,272 A | 6/2000 | Stell et al. | |
| 6,128,954 A | 10/2000 | Jiang | |

(Continued)

OTHER PUBLICATIONS

S. Pourkamali et al., "High frequency capacitive . . . with reduced motional resistance using the HARPSS technology," proceedings, 5th Silicon RF topical meeting 2004.

(Continued)

*Primary Examiner*—Thanh V Pham
*Assistant Examiner*—Maria Ligai
(74) *Attorney, Agent, or Firm*—Wolf, Greenfield & Sacks, P.C.

(57) ABSTRACT

Disclosed are methods for fabricating encapsulated microelectromechanical systems (MEMS) devices. A MEMS device fabricated on a CMOS wafer is encapsulated using an etch resistant thin film layer prior to the release of the MEMS device. Once CMOS processing is completed, the wafer is etched to release the MEMS device. If the MEMS is fabricated on a silicon-on-insulator (SOI) wafer, the buried oxide of the SOI wafer acts as an etch stop for the etching. A sacrificial layer(s) is accessed and removed from the back side of the wafer, while the front side of the wafer is protected by a masking layer. The MEMS device is released without having any detrimental effects on CMOS components. If desired, the wafer can be mounted on another substrate to provide hermetic or semi-hermetic sealing of the device.

29 Claims, 3 Drawing Sheets

U.S. PATENT DOCUMENTS

| | | | |
|---|---|---|---|
| 6,136,212 A | 10/2000 | Mastrangelo et al. | |
| 6,169,321 B1 | 1/2001 | Nguyen et al. | |
| 6,469,909 B2 | 10/2002 | Simmons | |
| 6,534,413 B1 | 3/2003 | Robertson et al. | |
| 6,539,801 B1 | 4/2003 | Gutierrez et al. | |
| 6,596,236 B2 | 7/2003 | DiMeo et al. | |
| 6,617,657 B1 | 9/2003 | Yao et al. | |
| 6,628,177 B2 | 9/2003 | Clark et al. | |
| 6,717,488 B2 | 4/2004 | Potter | |
| 6,743,656 B2 | 6/2004 | Orcutt et al. | |
| 6,744,335 B2* | 6/2004 | Ryhanen et al. | 333/185 |
| 6,803,637 B2 | 10/2004 | Benzel et al. | |
| 6,837,107 B2 | 1/2005 | Geen | |
| 6,841,861 B2 | 1/2005 | Brady | |
| 6,845,670 B1 | 1/2005 | McNeil et al. | |
| 6,848,304 B2 | 2/2005 | Geen | |
| 6,856,217 B1 | 2/2005 | Clark et al. | |
| 6,909,221 B2 | 6/2005 | Ayazi et al. | |
| 6,936,491 B2 | 8/2005 | Partridge et al. | |
| 6,936,494 B2 | 8/2005 | Cheung | |
| 6,952,041 B2 | 10/2005 | Lutz et al. | |
| 6,953,985 B2 | 10/2005 | Lin et al. | |
| 6,958,566 B2 | 10/2005 | Nguyen et al. | |
| 6,985,051 B2 | 1/2006 | Nguyen et al. | |
| 7,023,065 B2 | 4/2006 | Ayazi et al. | |
| 7,043,985 B2 | 5/2006 | Ayazi et al. | |
| 7,078,796 B2 | 7/2006 | Dunn et al. | |
| 7,176,770 B2 | 2/2007 | Ayazi et al. | |
| 7,337,671 B2 | 3/2008 | Ayazi et al. | |
| 7,360,423 B2 | 4/2008 | Ayazi et al. | |
| 7,543,496 B2 | 6/2009 | Ayazi et al. | |
| 2001/0002731 A1* | 6/2001 | Ueda | 257/750 |
| 2001/0011887 A1* | 8/2001 | Sturm et al. | 324/109 |
| 2001/0039834 A1 | 11/2001 | Hsu | |
| 2002/0038897 A1* | 4/2002 | Tuan et al. | 257/372 |
| 2002/0055236 A1* | 5/2002 | Chen | 438/437 |
| 2002/0063322 A1* | 5/2002 | Robbins et al. | 257/682 |
| 2002/0117728 A1* | 8/2002 | Brosnihan et al. | 257/446 |
| 2002/0148534 A2* | 10/2002 | Davis et al. | 148/33 |
| 2003/0000306 A1 | 1/2003 | Fell | |
| 2003/0122227 A1 | 7/2003 | Silverbrook | |
| 2003/0127944 A1 | 7/2003 | Clark et al. | |
| 2003/0196490 A1 | 10/2003 | Cardarelli | |
| 2003/0209073 A1 | 11/2003 | Carroll et al. | |
| 2004/0055380 A1 | 3/2004 | Shcheglov et al. | |
| 2004/0060898 A1 | 4/2004 | Tsai | |
| 2004/0115937 A1* | 6/2004 | Nagai et al. | 438/689 |
| 2004/0233503 A1* | 11/2004 | Kimura | 359/275 |
| 2004/0245586 A1 | 12/2004 | Partridge et al. | |
| 2005/0028591 A1 | 2/2005 | Lonsdale et al. | |
| 2005/0036269 A1 | 2/2005 | Ma et al. | |
| 2005/0095813 A1* | 5/2005 | Zhu et al. | 438/459 |
| 2005/0150296 A1 | 7/2005 | Painter et al. | |
| 2005/0172714 A1 | 8/2005 | Challoner et al. | |
| 2005/0277218 A1* | 12/2005 | Nakajo et al. | 438/46 |
| 2005/0287760 A1* | 12/2005 | Yan et al. | 438/404 |
| 2006/0014374 A1 | 1/2006 | Barth et al. | |
| 2006/0017523 A1 | 1/2006 | Bhave et al. | |
| 2006/0037417 A1 | 2/2006 | Shcheglov et al. | |
| 2006/0180898 A1* | 8/2006 | Funaki et al. | 257/619 |
| 2006/0197411 A1 | 9/2006 | Hoen et al. | |
| 2006/0232163 A1 | 10/2006 | Rudy et al. | |
| 2006/0266118 A1 | 11/2006 | Denison et al. | |
| 2006/0273416 A1 | 12/2006 | Ayazi et al. | |
| 2006/0283247 A1 | 12/2006 | Liu et al. | |
| 2007/0017287 A1 | 1/2007 | Kubena et al. | |
| 2007/0034005 A1 | 2/2007 | Acar et al. | |
| 2007/0079656 A1 | 4/2007 | Cook et al. | |
| 2007/0119258 A1 | 5/2007 | Yee | |
| 2007/0220971 A1 | 9/2007 | Ayazi et al. | |
| 2007/0240508 A1 | 10/2007 | Watson | |
| 2007/0273013 A1 | 11/2007 | Kohl et al. | |
| 2007/0281381 A1 | 12/2007 | Ayazi | |
| 2008/0028857 A1 | 2/2008 | Ayazi et al. | |
| 2008/0148846 A1 | 6/2008 | Whelan et al. | |
| 2009/0064781 A1 | 3/2009 | Ayazi et al. | |
| 2009/0095079 A1 | 4/2009 | Ayazi | |
| 2009/0266162 A1 | 10/2009 | Ayazi et al. | |
| 2009/0280594 A1 | 11/2009 | Mehregany | |

OTHER PUBLICATIONS

S. Pourkamali, et al., "VHF single crystal . . . implementation and characterization," Journal of Micro Electro Mechanical Systems, vol. 13, Issue 6, Dec. 2004, pp. 1054-1062.

Pourkamali, S. et al., "High frequency capacitive micromechanical resonators with reduced motional resistance using the HARPSS technology," Proceedings of 5$^{th}$ Silicon RF topical meeting, 2004, 4 pgs.

Pourkamali, S., et al., "VHF single crystal silicon capacitive elliptic bulk-mode dosl respmatprs—Part II: Implementation and characterization," Journal of Microelectromechanical Systems, Dec. 2004, pp. 1054-1062, vol. 13, No. 6.

Fuijita, T. et al., "Disk-shaped bulk micromachined gyroscope with vacuum sealing," Sensors and Actuators, May 2000, pp. 198-204, vol. 82.

Judy, M. W., "Evolution of integrated inertial MEMS technology," Solid-State Sensors, Actuators and Microsystems Workshop, Hilton Head Island South Carolina, Jun. 2004, pp. 27-32.

Zaman, M. F. et al., "The resonating star gyroscope," Proceedings IEEE Conference on MEMS, Jan. 2005, pp. 355-358.

Pourkamali, S. et al., "Vertical capacitive SiBARs," Proceedings MEMS'05, pp. 211-214.

Campanella, H., et al., "Accelerometer based on thin-film bulk acoustic wave resonators", IEEE Ultrasonics Symposium, 2007, pp. 1148-1151.

Lee, J. E-Y, et al. "A bulk acoustic mode single-crystal silicon microresonator with a high-quality factor", J. Micromech. Microeng, 2008, pp. 1-6, vol. 18.

* cited by examiner

METHOD FOR SEALING AND BACKSIDE RELEASING OF MICROELECTROMECHANICAL SYSTEMS

RELATED APPLICATION

This Application claims priority under 35 U.S.C. §119(e) to U.S. Provisional Application Serial No. 60/809,772, entitled "METHOD OF SEALING (PACKAGING) AND BACKSIDE RELEASE FOR MICROELECTROMECHANICAL SYSTEMS" filed on May 31, 2006.

BACKGROUND

The present invention relates generally to microelectromechanical systems processing and fabrication methods, and more particularly, to methods for sealing (i.e., packaging) and backside releasing of microelectromechanical systems (MEMS).

Reliable sealing/packaging of movable micromechanical devices is a very critical and challenging step in commercial development of such devices in industrial environments. The challenging aspect is having a hermetically sealed cap on top of the MEMS device that completely isolates it from the surrounding environment while maintaining the movability for the critical mechanical parts of the structure. In other words, the cap should not be in touch with any of the movable sections of the micromechanical system. Furthermore, for most micromechanical devices, operation in an inert or stable environment (sometimes vacuum) is a necessity or helps maximize the performance. On the other hand, the ability to integrate micromechanical sensors and actuators with active electronic circuitry is of great interest and is a key step in achieving higher levels of performance and integration in microelectronics.

Many high-performance MEMS devices use silicon dioxide as a sacrificial layer during the fabrication process. The sacrificial dioxide must be removed at the end of the fabrication process to release the device and render it movable and/or functional. The removal of the silicon dioxide is typically carried out in a hydrofluoric acid and de-ionized water (HF/$H_2O$) solution, which could also attack and damage passivation and interconnect layer(s) of a CMOS wafer. Therefore, sealing and release techniques that alleviate this problem are of great interest.

Various references discuss MEMS devices and processing methods for producing such devices. These include U.S. Pat. No. 7,023,065 of F. Ayazi et al., issued Apr. 4, 2006, U.S. Pat. No. 6,841,861 of Fredrick T. Brady issued January, 2005, U.S. Pat. No. 6,743,656 of Orcutt, et al., issued June 2004, U.S. Pat. No. 6,469,909 of Simmons, issued October 2002, a paper by S. Pourkamali and F. Ayazi, entitled "High frequency capacitive micromechanical resonators with reduced motional resistance using the HARPSS technology," proceedings, 5 Silicon RF topical meeting 2004, pp. 147-150, and a paper by S. Pourkamali, Z. Hao and F. Ayazi, entitled "VHF single crystal silicon side supported disk resonators— Part II: implementation and characterization" Journal of Micro Electro Mechanical Systems, Vol. 13, Issue 6, December 2004, pp. 1054-1062. U.S. Pat. No. 5,963,788 of Barron et al. issued Oct. 5, 1999 discloses a method to integrate MEMS devices with CMOS circuits. However, none of these references disclose or suggest a method for encapsulating the MEMS portion of a CMOS wafer, and releasing the wafer for long period of time in HF without damaging the CMOS portion.

It would be desirable to have methods for sealing and backside releasing of microelectromechanical systems with the possibility of providing a vacuum environment to the microelectromechanical device. It would also be desirable to have methods that are suitable for sealing and releasing MEMS integrated with CMOS or microelectronics circuits on a common substrate. It would be desirable to have microelectromechanical devices that are fabricated using the methods.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which.

DETAILED DESCRIPTION

Figure 1:
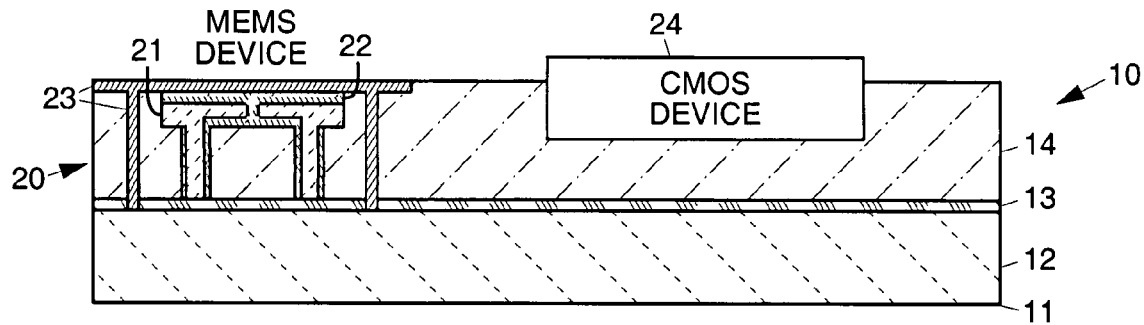
FIGS. 1-5 illustrate exemplary processing method for producing an exemplary MEMS device on a CMOS wafer.

Disclosed are microelectromechanical devices and packaging methods that encapsulate a MEMS portion of a CMOS wafer using an etch resistant (HF-resistant) thin film layer (such as silicon nitride, polysilicon, metal, or polymers) prior to releasing of the MEMS device (in HF solution, for example). Once the CMOS circuit and MEMS device processing is completed, the wafer is wet or dry etched from the back side beneath the MEMS device portion. If the MEMS device is fabricated on a silicon-on-insulator (SOI) wafer, for example, the buried oxide of the SOI wafer acts as an etch stop for backside etching. The front side of the wafer is protected by a masking layer, and the sacrificial layer(s) of the MEMS device is then accessed and removed from the back side of the wafer. The MEMS device is therefore released without having any detrimental effect on CMOS circuit. If desired, after releasing the wafer can be mounted on or hermetically bonded to another wafer (carrier wafer or package substrate) to provide hermetic or semi-hermetic sealing of the MEMS device. The hermetically-bonded carrier wafer or package substrate can have getter thin-films deposited on the areas exposed to the MEMS portion to ensure long-term vacuum.

The disclosed method is a generic packaging and/or sealing and release method that can be used with other types of sacrificial layers besides silicon dioxide, including germanium, and aluminum, for example. The method is also not limited to CMOS wafers and can be applied to many types of MEMS devices on various substrates, including silicon-carbide-on-insulator substrate (with or without circuitry), for example.

Referring to the drawing figures, FIGS. 1-5 illustrate an exemplary processing method 10 for producing a MEMS device 20 on a CMOS silicon-on-insulator (SOI) wafer 11 (such as a silicon-on-oxide wafer 11) that is used to encapsulate and release the MEMS device 20 from the CMOS SOI wafer 11. The CMOS SOI wafer 11 comprises a lower silicon handle layer 12, an insulating layer 13 such as a silicon dioxide layer 13 (1-3 micrometers in thickness), and an upper device layer 14 that can be a few micrometers to a few hundreds of micrometers in thickness. It should be mentioned that the use of SOI wafers is not necessary to render the sealing and backside release technique disclosed in this application operational. Regular silicon wafers can be used equally well with this technique. The advantage of the SOI wafer is in providing electrical isolation between the body of the MEMS devices and the substrate, as well as providing an etch stop during the backside release of the MEMS device, which in turn enables accurate control of the thickness of the MEMS device and protects it from the silicon etchant. Silicon carbide, silicon carbide-on-insulator, (ultra) nano-crystalline diamond, gallium arsenide wafers can be used equally well in this method.

As is shown in FIG. 1, a representative MEMS device 20, such as a capacitive micromechanical resonator, a gyroscope or an accelerometer, for example, is fabricated in the CMOS wafer 11. The MEMS device could be fabricated prior to, between, or after the CMOS fabrication steps. The MEMS device can be fabricated using the well-known HARPSS process as outlined in U.S. Pat. No. 7,023,065 of Ayazi et al. The MEMS device 20 is fabricated with a movable or vibratable silicon structure 21 surrounded by a removable sacrificial layer 22, such as silicon dioxide, for example. The MEMS device 20 is sealed using an etch resistant layer 23, such as a low pressure chemical vacuum deposited (LPCVD) hydrofluoric acid (HF) resistant layer 23, which may be silicon nitride and/or polysilicon, for example.

Figure 2:
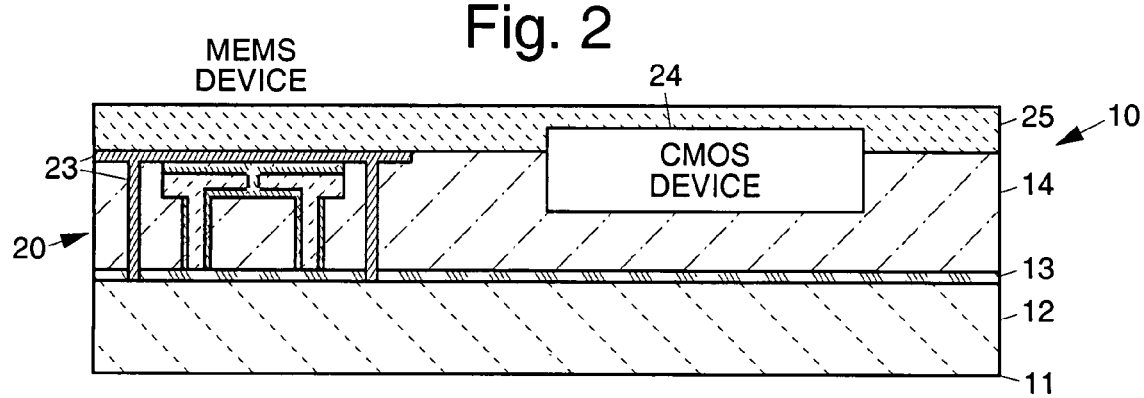

As is shown in FIG. 2, a conventional CMOS circuit 24 is fabricated that is typically electrically connected to the MEMS device 20 and other components fabricated on the CMOS SOI wafer 11 using lithographically-defined interconnects (not shown). The MEMS device 20 and CMOS circuit 24 are covered by a passivation layer 25 that protects the devices 20, 24. Although not necessary, peripheral trenches can be etched around the MEMS device(s) through the upper device and oxide layers of the SOI wafer, and filled with the HF-resistant layer 23 to block lateral undercut of the buried oxide of the SOI wafer during the backside release. As will be discussed below, the MEMS device 20 needs to be released, i.e., the sacrificial layer surrounding all or portion of the MEMS device needs to be removed to render the device movable so that it can properly function. This is achieved by removing the sacrificial layer 22, typically using a $HF/H_2O$ solution. However, the CMOS portion of the wafer 11 should not be exposed to the $HF/H_2O$ solution as it can also attack and remove the passivation and/or the metallization layers 25 and damage the CMOS circuit 24.

Figure 3:
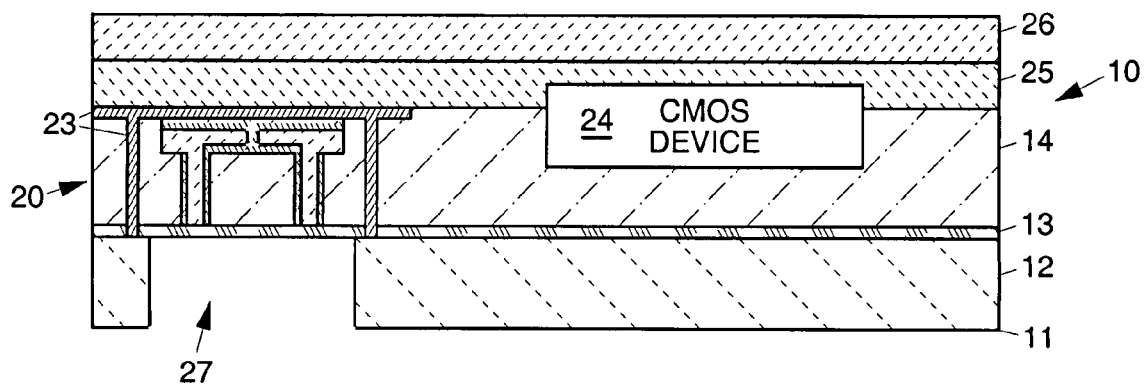

Therefore, as is shown in FIG. 3, a solid (unpatterned) masking layer 26 is deposited on the front side of the wafer 11 on top of the passivation layer 25. Then, the back side of the CMOS SOI wafer 11 is etched, using either a dry or wet etching procedure, to remove a portion of the handle layer beneath the MEMS device 20, and the silicon oxide layer 13 acts as an etch stop. This produces a cavity 27 beneath the MEMS device 20.

Figure 4:
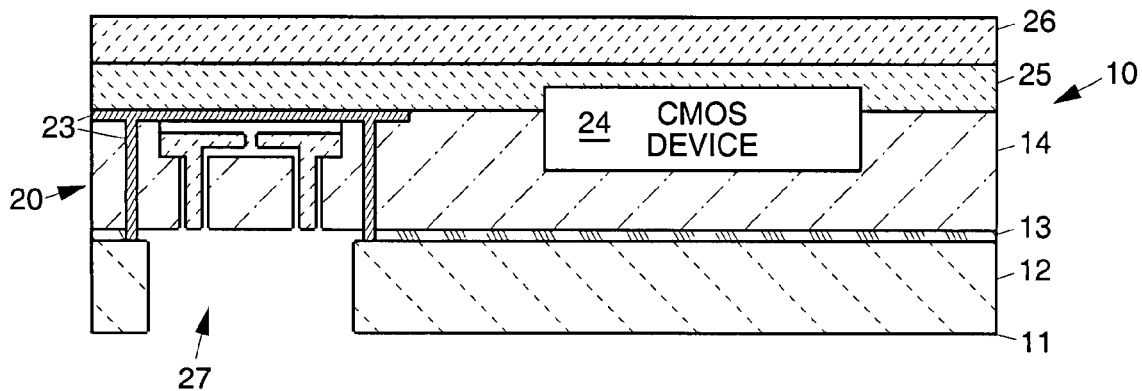
Figure 5:
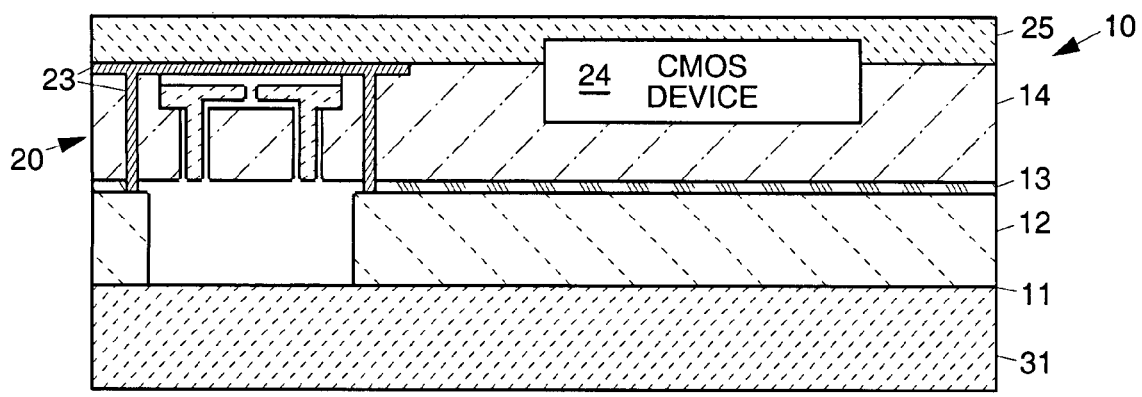

Then, as is shown in FIG. 4, the MEMS device 20 is released from the SOI wafer 21 using hydrofluoric acid (HF) solution, for example. Releasing the MEMS device 20 removes the sacrificial layer 22 surrounding the moveable portion of the MEMS device 20 comprising the vibratable or movable silicon structure 21. The masking layer 26 is removed, as is shown in FIG. 5. This completes fabrication of the exemplary MEMS device 20. Note that the MOEMS device 20 may be fabricated using the techniques outlined in U.S. Pat. No. 7,023,065, the contents of which are incorporated herein by reference.

In addition, and as is shown in FIG. 5, after the masking layer 26 is removed, the SOI wafer 21 comprising the MEMS device 20 and CMOS circuit 24 may be mounted on or bonded to a second substrate 31 or wafer 31, comprising a carrier wafer 31 or package substrate 31.

Figure 6:
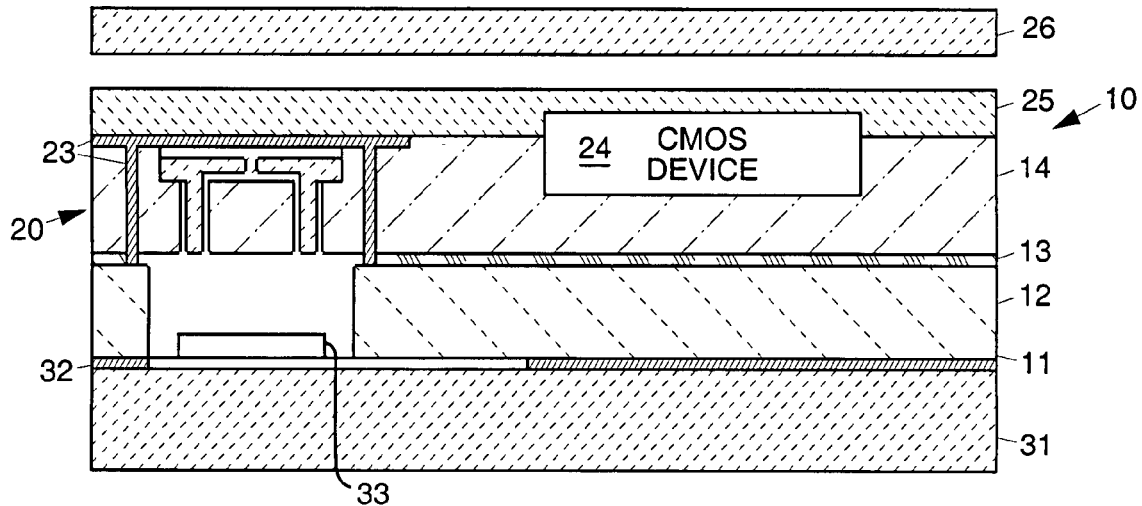
FIG. 6 illustrates another exemplary embodiment of a MEMS device fabricated in accordance with the disclosed method that includes an intermediate metallic bonding layer.

FIG. 6 illustrates another embodiment of a CMOS SOI wafer 11 comprising a MEMS device 20 and a CMOS circuit 24 fabricated using the method disclosed with reference to FIGS. 1-5. This embodiment of the wafer 11 includes an intermediate metallic bonding layer 32 (e.g., gold) interposed between the handle substrate 12 and the second substrate 31 or wafer 31 (carrier wafer 31 or package substrate 31). FIG. 6 also illustrates that a getter material/layer 33 or nanogetter layer 33 may be disposed in the cavity beneath the MEMS device 20. The getter 33 acts to create a vacuum surrounding the MEMS device 20.

Figure 7:
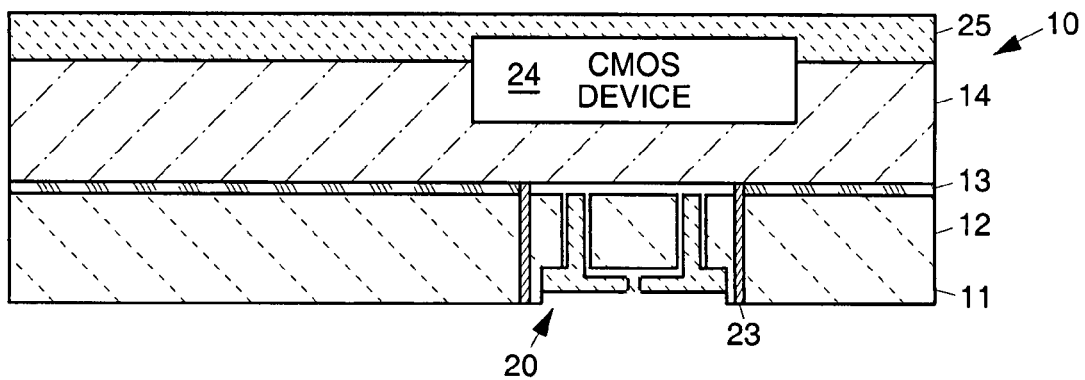
FIG. 7 illustrates another exemplary embodiment of a MEMS device fabricated in accordance with the disclosed method.

FIG. 7 illustrates another exemplary embodiment of a MEMS device 20 fabricated in accordance with the disclosed method. In this embodiment, the MEMS device 20 is fabricated on the back side of the CMOS wafer 11. The CMOS wafer can be an SOI wafer in which the MEMS device is fabricated in the handle layer prior to, between or after fabrication of the CMOS circuit 24. In fabricating this embodiment, the optional masking layer 26 is used on the front side of the wafer 11 on top of the passivation layer 25 to protect the CMOS circuit 24 during release of the backside MEMS device. The MEMS device 20 can be electrically connected to the front side CMOS circuit 24 using through wafer electrical via lines or using some external wiring means. In this embodiment, the use of the HF-resistant layer 23 is not necessary.

Figure 8:
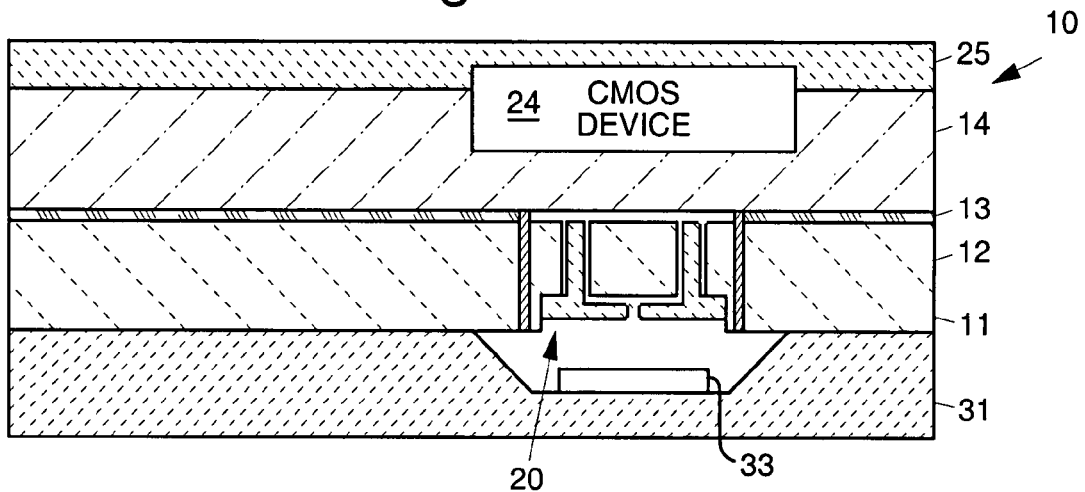
FIG. 8 illustrates yet another exemplary embodiment of a MEMS device fabricated in accordance with the disclosed method.

FIG. 8 illustrates yet another exemplary embodiment of a MEMS device 20 fabricated in accordance with the disclosed method. This embodiment is substantially the same as is shown in FIG. 7, but the SOI wafer 21 is mounted 17 to the second substrate 31 or wafer 31, comprising the carrier wafer 31 or package substrate 31. An optional cavity is formed in the carrier wafer 31 or package substrate 31 to create a clearance between the MEMS device and the second substrate 31 or wafer 31. A getter material/layer 33 or nanogetter layer 33 may be disposed in the cavity in the carrier wafer 31 or package substrate 31 which is used to create a vacuum surrounding the MEMS device 20.

Figure 9:
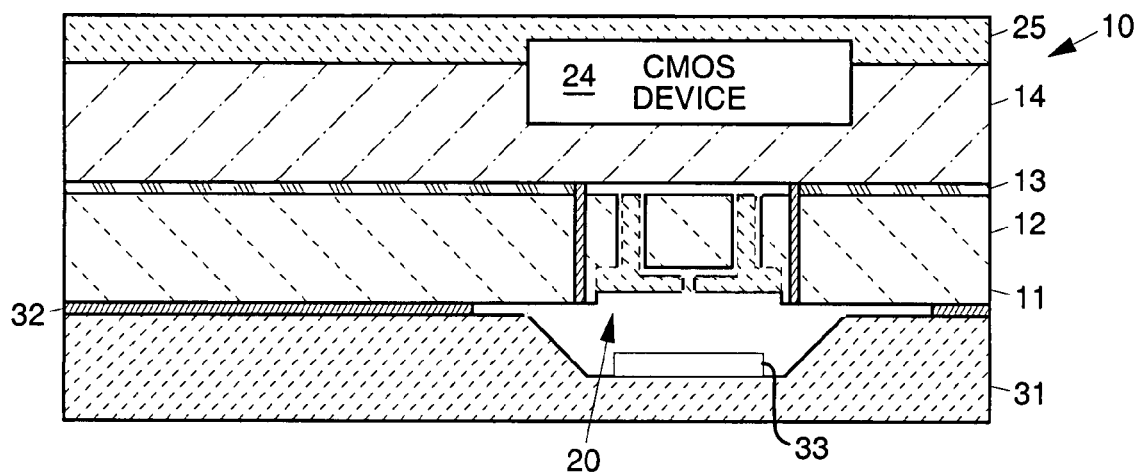
FIG. 9 illustrates yet another exemplary embodiment of a MEMS device fabricated in accordance with the disclosed method.

FIG. 9 illustrates yet another exemplary embodiment of a MEMS device 20 fabricated in accordance with the disclosed method. This embodiment is substantially the same as is shown in FIG. 8, with the SOI wafer 21 mounted 17 to the carrier wafer 31 or package substrate 31. In addition, this embodiment of the wafer 11 includes an intermediate metallic bonding layer 32 such as gold interposed between the handle substrate 12 and the carrier wafer 31 or package substrate 31. A cavity is formed in the carrier wafer 31 or package substrate 31. A getter material/layer 33 or nanogetter layer 33 may be disposed in the cavity in the carrier wafer 31 or package substrate 31 which is used to create a vacuum surrounding the MEMS device 20.

Thus, methods of sealing and backside releasing of microelectromechanical systems (MEMS) devices have been disclosed. It is to be understood that the above-described embodiments are merely illustrative of some of the many specific embodiments that represent applications of the principles discussed above. Clearly, numerous and other arrangements can be readily devised by those skilled in the art without departing from the scope of the invention.

What is claimed is:

1. A method for encapsulating and integrating nano- and/or micro-electromechanical systems (MEMS) comprising:
providing a semiconductor-on-insulator substrate comprising a handle layer, a device layer, and an insulating layer disposed between the handle and device layers;

fabricating a transistor-based circuit in the device layer;
fabricating a MEMS device in the device layer;
forming an etch resistant layer over the MEMS device and into the device layer;
forming a silicon dioxide sacrificial layer;
etching the handle layer beneath the MEMS device using the insulating layer as an etch stop; and
releasing the MEMS device from the device layer through the backside of the substrate using an etchant, wherein the etch-resistant layer is resistant to the etchant and the etch-resistant layer protects the transistor-based circuit from the etchant,
wherein releasing the MEMS device comprises removing the silicon dioxide sacrificial layer in a hydrofluoric acid.

2. The method recited in claim 1 wherein the transistor-based circuit is a CMOS circuit.

3. The method recited in claim 1 further comprising:
attaching the handle layer to another substrate, thereby forming an enclosed sealed cavity in which the MEMS device is disposed.

4. The method recited in claim 3 further comprising:
disposing a getter material in the enclosed sealed cavity.

5. The method recited in claim 1 wherein the device layer of the substrate is a semiconductor selected from a group including single crystalline silicon, poly-crystalline silicon, silicon carbide, diamond, gallium nitride and gallium arsenide.

6. The method recited in claim 1 wherein the MEMS device comprises a resonator.

7. The method recited in claim 1 wherein the etch resistant layer comprises a low-pressure chemical vapor deposited (LPCVD) hydrofluoric acid resistant layer.

8. The method recited in claim 1 wherein the etch resistant layer comprises a silicon nitride layer.

9. The method recited in claim 1 wherein the etch resistant layer comprises a polysilicon layer.

10. The method recited in claim 1 wherein the semiconductor-on-insulator substrate comprises a silicon-on-silicon dioxide substrate.

11. The method of claim 1, further comprising:
covering the transistor-based circuit and the MEMS device with a masking layer, wherein the masking layer is resistant to the etchant and further protects the transistor-based circuit from the etchant.

12. The method of claim 1, wherein the etch resistant layer extends over the MEMS device on a frontside of the substrate, wherein the etch resistant layer extends through the device layer.

13. The method of claim 12, wherein the etch resistant layer contacts the handle layer.

14. The method of claim 1, wherein the etch resistant layer is spaced apart from a movable portion of the MEMS device.

15. The method of claim 1, further comprising:
forming, in the device layer, a sacrificial layer that immobilizes the MEMS device,
wherein releasing the MEMS device comprises removing the sacrificial layer through the backside of the substrate using the etchant.

16. A method for encapsulating and integrating nano and/or microelectromechanical systems (MEMS) comprising:
providing a semiconductor-on-insulator substrate comprising a handle layer, a device layer, and an insulating layer disposed between the handle and device layers;
fabricating a transistor-based circuit in the device layer;
covering the transistor-based circuit with a masking layer;
fabricating a MEMS device in the handle layer;
fabricating, in the handle layer, a sacrificial layer that immobilizes the MEMS device; and
releasing the MEMS device using an etchant to remove the sacrificial layer, wherein the masking layer is resistant to the etchant and the masking layer protects the transistor-based circuit from the etchant.

17. The method recited in claim 16 wherein the transistor based circuit is a CMOS circuit.

18. The method recited in claim 17 wherein the MEMS device comprises a resonator.

19. The method recited in claim 16 wherein the device layer of the substrate is a semiconductor selected from a group including single crystalline silicon, poly-crystalline silicon, silicon carbide, diamond, gallium nitride and gallium arsenide.

20. The method recited in claim 19 further comprising:
attaching the handle layer to another substrate, thereby forming an enclosed sealed cavity in which the MEMS device is disposed.

21. The method recited in claim 20 further comprising:
disposing a getter material in the enclosed sealed cavity.

22. The method recited in claim 16 wherein releasing the MEMS device from the substrate comprises removing a silicon dioxide sacrificial layer in a hydrofluoric acid.

23. A method for encapsulating and integrating nano- and/or micro-electromechanical systems (MEMS) comprising:
providing a semiconductor-on-insulator substrate comprising a handle layer, a device layer, and an insulating layer disposed between the handle and device layers;
fabricating a transistor-based circuit in the device layer;
fabricating a MEMS device in the device layer;
covering the MEMS device with an etch resistant layer;
etching the handle layer beneath the MEMS device using the insulating layer as an etch stop; and
releasing the MEMS device from the device layer through the backside of the substrate using an etchant, wherein the etch-resistant layer is resistant to the etchant and the etch-resistant layer protects the transistor-based circuit from the etchant,
wherein the etch resistant layer extends over the MEMS device on a frontside of the substrate, wherein the etch resistant layer extends through the device layer and contacts the handle layer.

24. The method of claim 23, further comprising:
attaching the handle layer to another substrate, thereby forming an enclosed sealed cavity in which the MEMS device is disposed.

25. The method recited in claim 23, wherein releasing the MEMS device comprises removing a sacrificial layer from the device layer using the etchant.

26. The method of claim 25, wherein the sacrificial layer comprises silicon dioxide and the etchant comprises hydrofluoric acid.

27. The method of claim 23, further comprising:
covering the transistor-based circuit and the MEMS device with an unpatterned masking layer,
wherein the unpatterned masking layer is resistant to the etchant and protects the transistor-based circuit from the etchant.

28. The method of claim 23, wherein the etch resistant layer comprises a material selected from the group consisting of silicon nitride and polysilicon.

29. The method of claim 23, wherein the etch resistant layer is formed by low-pressure chemical vapor deposition.

* * * * *